(12) United States Patent
Mori

(10) Patent No.: US 12,027,393 B2
(45) Date of Patent: Jul. 2, 2024

(54) SUBSTRATE PROCESSING APPARATUS AND SUBSTRATE PROCESSING METHOD

(71) Applicant: Tokyo Electron Limited, Tokyo (JP)

(72) Inventor: Takuya Mori, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 456 days.

(21) Appl. No.: 17/236,160

(22) Filed: Apr. 21, 2021

(65) Prior Publication Data

US 2021/0335636 A1   Oct. 28, 2021

(30) Foreign Application Priority Data

Apr. 22, 2020   (JP) .................................. 2020-076291

(51) Int. Cl.
*H01L 21/67* (2006.01)
*G03F 7/16* (2006.01)
*H01L 21/027* (2006.01)
*H01L 21/66* (2006.01)
*H01L 21/677* (2006.01)

(52) U.S. Cl.
CPC ........ *H01L 21/67253* (2013.01); *G03F 7/162* (2013.01); *H01L 21/0274* (2013.01); *H01L 21/67742* (2013.01); *H01L 22/12* (2013.01)

(58) Field of Classification Search
CPC .......... H01L 21/67242; H01L 21/67253; H01L 21/67288; G01B 11/02; G01B 11/06; G01B 11/0616

See application file for complete search history.

(56) References Cited

U.S. PATENT DOCUMENTS

2022/0050391 A1*   2/2022   Dillen ................ G01B 11/0608

FOREIGN PATENT DOCUMENTS

| JP | H11-220004 A | 8/1999 |
|---|---|---|
| JP | 2007-212230 A | 8/2007 |
| JP | 2013-131543 A | 7/2013 |
| JP | 2015-215193 A | 12/2015 |
| JP | 2018-160534 A | 10/2018 |

* cited by examiner

*Primary Examiner* — Jae Lee
(74) *Attorney, Agent, or Firm* — Pearne & Gordon LLP

(57) ABSTRACT

A substrate processing apparatus includes a processing unit configured to perform a preset processing on a substrate; a transfer unit, including a holder configured to hold the substrate, configured to carry the substrate into/from the processing unit by displacing the holder which holds the substrate; and a substrate inspection unit configured to acquire, at an outside of the processing unit, information indicating a surface state of the substrate held by the holder.

8 Claims, 12 Drawing Sheets

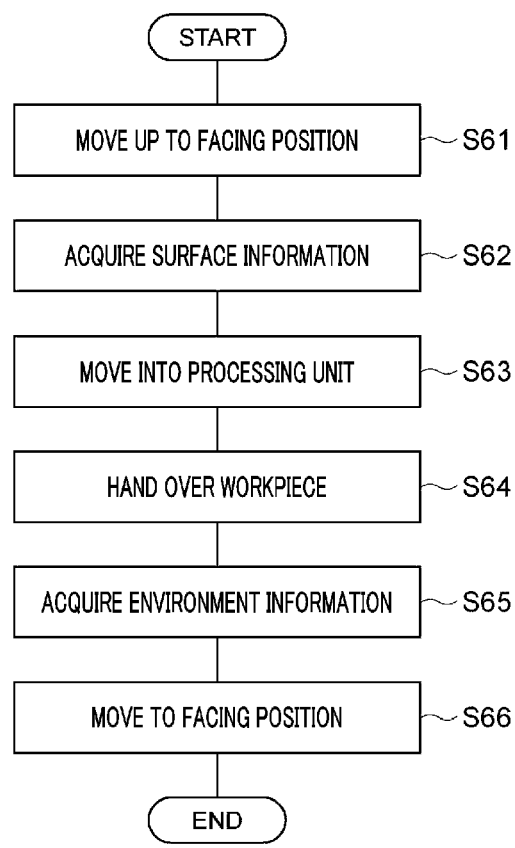

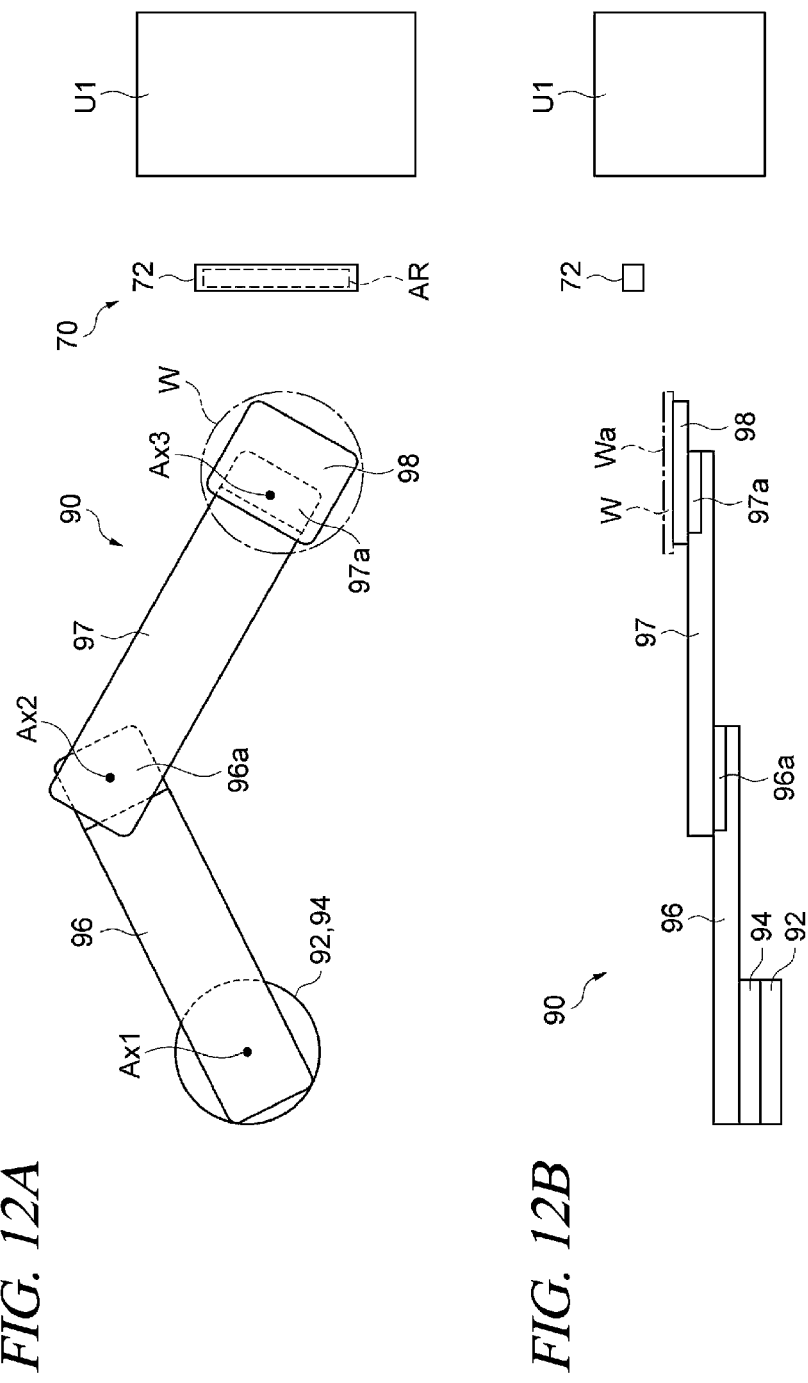

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-076291 filed on Apr. 22, 2020, the entire disclosure of which IS incorporated herein by reference.

TECHNICAL FIELD

The various aspects and embodiments described herein pertain generally to a substrate processing apparatus and a substrate processing method.

BACKGROUND

Patent Document 1 describes a film thickness measuring device configured to measure a thickness of a film formed on a substrate. This film thickness measuring device includes an imaging device configured to image a surface of the substrate; and a film thickness calculator configured to calculate the thickness of the film formed on the substrate based on pixel values of the obtained image of the substrate as a target of film thickness measurement. In a substrate processing system (substrate processing apparatus) equipped with this film thickness measuring device, inspection of the substrate is carried out through the film thickness measurement based on the obtained image.

Patent Document 1: Japanese Patent Laid-open Publication No. 2015-215193

SUMMARY

In an exemplary embodiment, a substrate processing apparatus includes a processing unit configured to perform a preset processing on a substrate; a transfer unit, including a holder configured to hold the substrate, configured to carry the substrate into/from the processing unit by displacing the holder which holds the substrate; and a substrate inspection unit configured to acquire, at an outside of the processing unit, information indicating a surface state of the substrate held by the holder.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 11 is a flowchart illustrating an example of an inspection processing performed when the substrate is carried into the processing unit; and FIG. 12A and FIG. 12B are a plan view and a side view schematically illustrating an example of a transfer unit, respectively.

DETAILED DESCRIPTION

Figure 1:
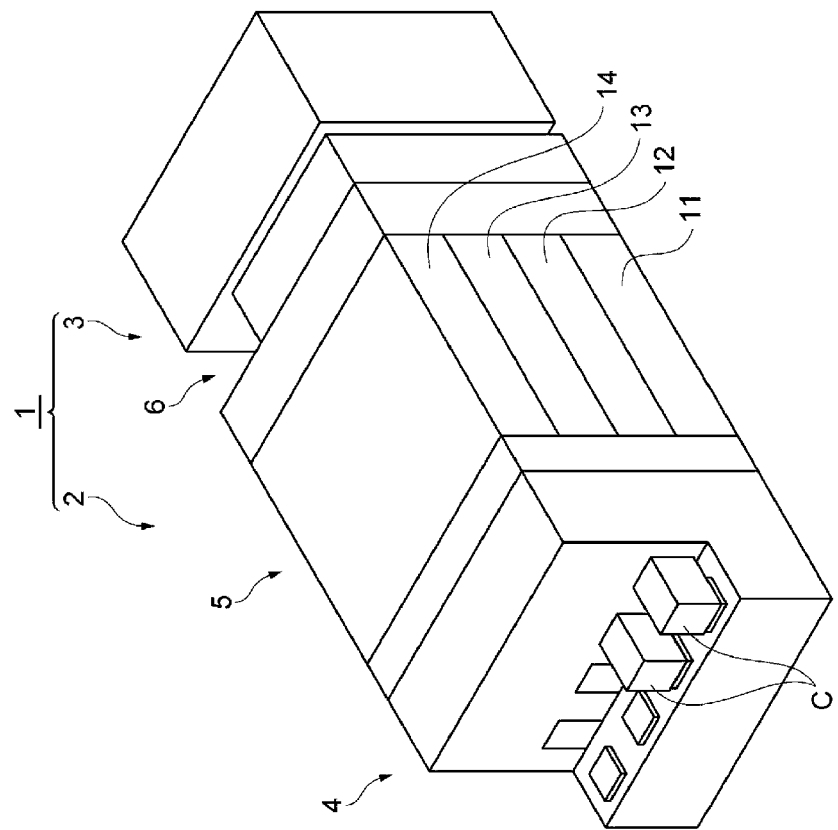
FIG. 1 is a schematic perspective view illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the following description, same parts or parts having same functions will be assigned same reference numerals, and redundant description thereof will be omitted.

[Substrate Processing System]

A substrate processing system 1 shown in FIG. 1 is a system configured to perform, on a workpiece W, formation of a photosensitive film, exposure of the photosensitive film, and development of the photosensitive film. The workpiece W as a processing target is, for example, a substrate, or a substrate having a film or a circuit formed thereon as a result of being subjected to a preset processing. The substrate as an example of the workpiece W is, for example, a wafer including silicon. The workpiece W (substrate) may have a circular shape. The workpiece W as the processing target may be a glass substrate, a mask substrate, a FPD (Flat Panel Display), or the like, or an intermediate product obtained by performing a preset processing on any of these substrates. The photosensitive film is, for example, a resist film.

The substrate processing system 1 includes a coating and developing apparatus 2 and an exposure apparatus 3. The exposure apparatus 3 is configured to expose a resist film (photosensitive film) formed on the workpiece W (substrate). To elaborate, the exposure apparatus 3 radiates an energy beam to an exposure target portion of the resist film by an immersion exposure method or the like. The coating and developing apparatus 2 is configured to perform a processing of forming the resist film by coating a resist (chemical liquid) on a surface of the workpiece W prior to the exposure processing by the exposure apparatus 3, and is also configured to perform a developing processing of the resist film after the exposure processing.

<Substrate Processing Apparatus>

Figure 2:
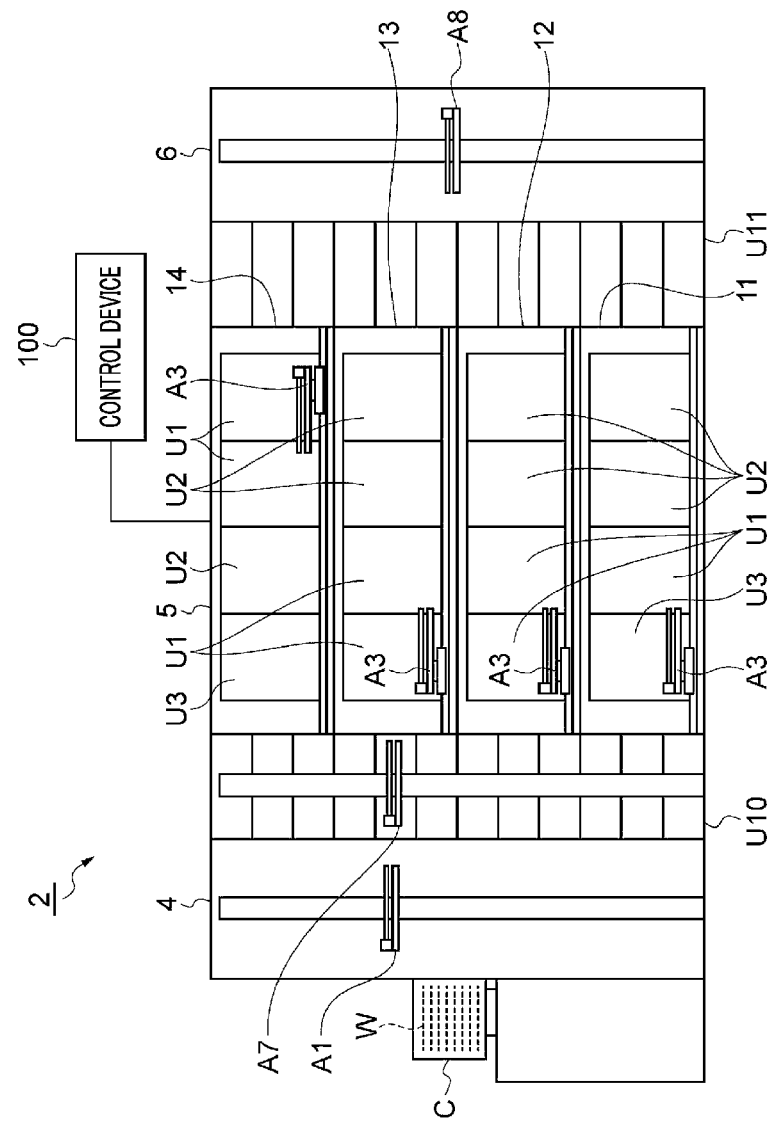
FIG. 2 is a schematic diagram illustrating an example of a coating and developing apparatus.

Below, a configuration of the coating and developing apparatus 2 as an example of a substrate processing apparatus will be explained. As depicted in FIG. 1 and FIG. 2, the coating and developing apparatus 2 is equipped with a carrier block 4, a processing block 5, an interface block 6, and a control device 100.

The carrier block 4 is configured to carry the workpiece W into/from the coating and developing apparatus 2. For example, the carrier block 4 is configured to support a plurality of carriers C for the workpiece W, and incorporates therein a transfer device A1 including a delivery arm. Each carrier C accommodates therein, for example, a multiple number of circular workpieces W. The transfer device A1 is configured to take out the workpiece W from the carrier C, hand the workpiece W over to the processing block 5, receive the workpiece W from the processing block 5 and return the workpiece W back into the carrier C. The processing block 5 includes processing modules 11, 12, 13 and 14.

The processing module 11 incorporates therein a liquid processing unit U1, a heat treatment unit U2 and a transfer device A3 configured to transfer the workpiece W into these units. The processing module 11 is configured to form a bottom film on a front surface of the workpiece W by the liquid processing unit U1 and the heat treatment unit U2. The liquid processing unit U1 is configured to coat a processing liquid for forming the bottom film on the workpiece W. The heat treatment unit U2 is configured to perform various kinds of heat treatments required to form the bottom film. The processing module 11 may be further equipped with an inspection unit U3 (processing unit). The inspection unit U3 is configured to inspect the workpiece W by acquiring a state of the workpiece W. For example, the inspection unit U3 is configured to take an image of the front surface, a rear surface or a peripheral portion of the workpiece before forming the bottom film with a camera, and outputs the image taken by the camera to the control device 100.

The processing module 12 incorporates therein a liquid processing unit U1, a heat treatment unit U2 and a transfer device A3 configured to transfer the workpiece W into these units. The processing module 12 is configured to form a resist film on the bottom film by the liquid processing unit U1 and the heat treatment unit U2. The liquid processing unit U1 is configured to coat, on the bottom film, a processing liquid (resist) for forming the resist film. The heat treatment unit U2 is configured to perform various kinds of heat treatments required to form the resist film.

The processing module 13 incorporates therein a liquid processing unit U1, a heat treatment unit U2, and a transfer device A3 configured to transfer the workpiece W into these units. The processing module 13 is configured to form a top film on the resist film by the liquid processing unit U1 and the heat treatment unit U2. The liquid processing unit U1 is configured to coat, on the resist film, a processing liquid for forming the top film. The heat treatment unit U2 is configured to perform various kinds of heat treatments required to form the top film.

The processing module 14 incorporates therein a liquid processing unit U1, a heat treatment unit U2 and a transfer device A3 configured to transfer the workpiece W into these units. The processing module 14 is configured to perform a developing processing on the resist film after being subjected to an exposure processing and, also, perform heat treatments required for the developing processing by the liquid processing unit U1 and the heat treatment unit U2. The liquid processing unit U1 performs the developing processing for the resist film by coating a developing liquid on the front surface of the workpiece W after being subjected to the exposure processing and then washing out the coated developing liquid with a rinse liquid. The heat treatment unit U2 is configured to perform the various kinds of heat treatments required for the developing processing. Specific examples of these heat treatments include a heat treatment (PEB: Post Exposure Bake) before developing, a heat treatment (PB: Post Bake) after developing, and so forth. The processing module 14 may further include an inspection unit U3. For example, the inspection unit U3 is configured to take an image of the front surface, the rear surface or the peripheral portion of the workpiece W after being subjected to the developing processing (after the PB) with a camera, and outputs the image taken by the camera to the control device 100.

Within the processing block 5, a shelf unit U10 is provided near the carrier block 4. The shelf unit U10 is partitioned into a multiple number of cells arranged in a vertical direction. A transfer device A7 including an elevating arm is provided near the shelf unit 10. The transfer device A7 is configured to move the wafer W up and down between the cells of the shelf unit U10.

Within the processing block 5, a shelf unit U11 is provided near the interface block 6. The shelf unit U11 is partitioned into a multiple number of cells arranged in the vertical direction. As these shelf units U10 and U11 allow the workpiece W to stand by therein before being subjected to a next processing (that is, as they serve as buffers), the shelf units U10 and U11 correspond to processing units configured to perform a processing on the workpiece W.

The interface block 6 is configured to deliver the workpiece W into/from the exposure apparatus 3. By way of example, the interface block 6 incorporates therein a transfer device A8 including a delivery arm and is connected to the exposure apparatus 3. The transfer device A8 is configured to deliver the workpiece W placed in the shelf unit U11 to the exposure apparatus 3. The transfer device A8 is also configured to receive the workpiece W from the exposure apparatus 3 and return it back into the shelf unit U11.

<Transfer Device>

Now, an example of the transfer device A3 in the processing module 12 will be described in detail with reference to FIG. 3 and FIG. 4. The transfer device A3 (transfer unit) is configured to transfer the workpiece W within the processing module 12 while holding the workpiece W. To transfer the workpiece W between the multiple processing units belonging to the processing module 12, the transfer device A3 transfers the workpiece W at an outside of the processing units. Here, the outside of the processing units refers to a region of the processing module 12 other than internal spaces of the multiple processing units (for example, spaces surrounded by housings of the processing units). In the processing module 12 shown in FIG. 3, the multiple liquid processing units U1 are arranged side by side along one horizontal direction. In the following description, the direction in which the liquid processing units U1 are arranged will be referred to as "direction D1," and a direction perpendicular to the direction D1 will be referred to as "direction D2". The transfer device A3 is configured to move the workpiece W along the directions D1 and D2 at least.

The transfer device A3 is equipped with a holding arm 20 (holder). The holding arm 20 is configured to hold the workpiece W. The holding arm 20 holds the workpiece W such that a main surface Wa of the workpiece W faces down. The main surface Wa is a surface of the workpiece W on which the coating film of the resist is formed in the liquid processing unit U1. The holding arm 20 may be configured to surround a periphery of the workpiece W and support a peripheral portion of a main surface Wb (rear surface) of the workpiece W opposite to the main surface Wa. The transfer device A3 carries the workpiece W into/from the liquid processing unit U1 by displacing the holding arm 20 holding the workpiece W. That is, the transfer device A3 carries the workpiece W into the one liquid processing unit U1 by displacing the holding arm 20, and carries out the workpiece W from the corresponding one liquid processing unit U1 by displacing the holding arm 20. The transfer device A3 may be configured to carry multiple workpieces W into/from the multiple processing units U1 individually.

The transfer device A3 is further quipped with, for example, a first driving unit 30 (first driving unit) and a second driving unit 50 (second driving unit). The first driving unit 30 is configured to move the holding arm 20 along the direction D2 (first direction) at least. The first driving unit 30 includes, as depicted in FIG. 4, for example, a driver 32, a rotation driver 46, and a base 48.

The driver 32 is an actuator configured to move the holding arm 20 back and forth along one horizontal direction by a power source such as a motor. The driver 32 moves the holding arm 20 (back and front) along the direction D2 at least. As the driver 32 displaces the holding arm 20 in the direction D2, the workpiece W held by the holding arm 20 is moved along the direction D2.

Figure 4:
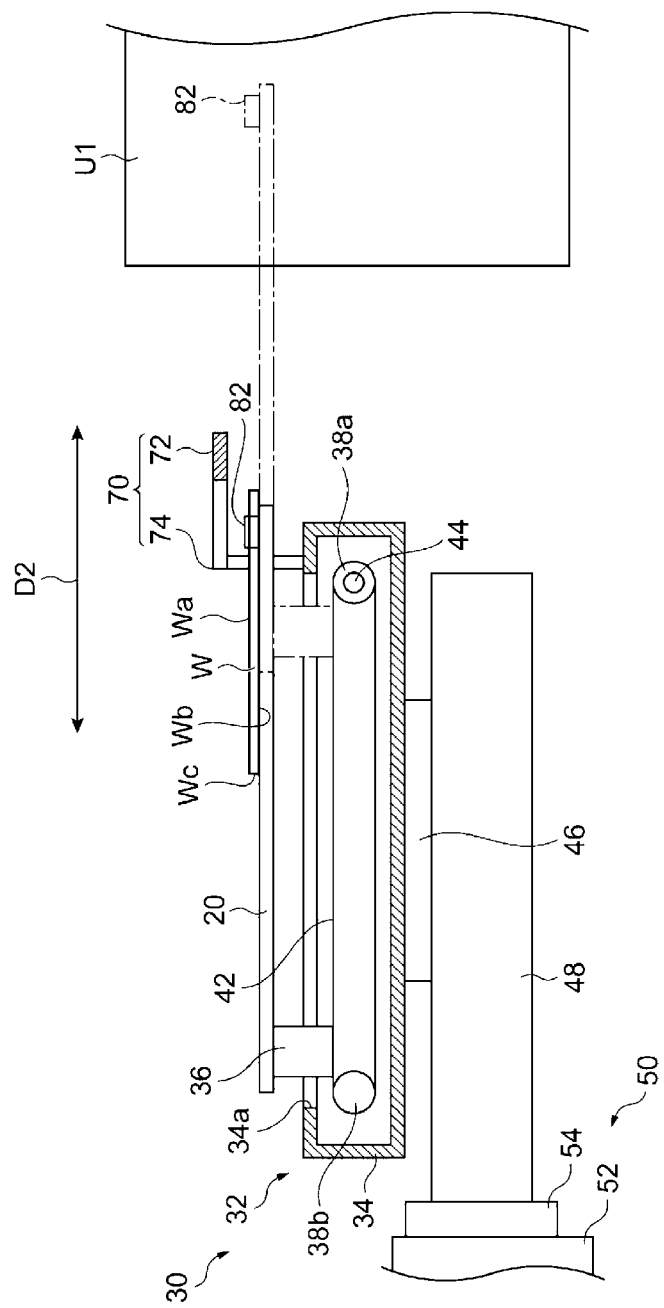
FIG. 4 is a side view schematically illustrating an example of a transfer unit.

The driver 32 includes, as shown in FIG. 4, for example, a housing 34, a sliding member 36, pulleys 38a and 38b, a belt 42, and a motor 44. The housing 34 accommodates therein the individual components belonging to the driver 32. An opening 34a is provided at an upper wall of the housing 34. The sliding member 36 is configured to be moved relative to the housing 34. The sliding member 36 extends along the vertical direction. A lower end of the sliding member 36 is connected to the belt 42 within the housing 34. An upper end of the sliding member 36 is protruded to an outside of the housing 34 through the opening 34a, and a base end of the holding arm 20 is connected to the upper end of the sliding member 36. The pulleys 38a and 38b are disposed at two opposite ends within the housing 34 in the direction D2. Each of the pulleys 38a and 38b is disposed within the housing 34 so as to be rotatable around a rotation axis corresponding to the direction D1.

The belt 42 is wound around the pulleys 38a and 38b. The belt 42 is, for example, a timing belt. The motor 44 is a power source configured to generate a rotational torque. The motor 44 is, for example, a servo-motor. If the torque (driving force) by the motor 44 is delivered to the pulley 38a, the belt 42 wound around the pulleys 38a and 38b is moved along the direction D2. Accordingly, the sliding member 36 is also moved in the direction D2 (the holding arm 20 is displaced in the direction D2).

The rotation driver 46 is a rotational actuator configured to rotate the driver 32 around a vertical rotation axis by a power source such as, but not limited to, a motor. The rotation driver 46 supports the driver 32. As the driver 32 is rotated by the rotation driver 46, a moving direction (an angle with respect to the direction D2) of the holding arm 20 by the driver 32 is changed. The base 48 is a member supporting the rotation driver 46 and the driver 32. The rotation driver 46 is provided on the base 48, and the base 48 is extended along the direction D2, for example. One end of the base 48 in the direction D2 is connected to the second driving unit 50.

The first driving unit 30 (driver 32) described above moves the holding arm 20 such that a relative position of the holding arm 20 with respect to the housing 34 changes. For example, the driver 32 moves the holding arm 20 in the direction D2 between a position where a leading end of the holding arm 20 is overlapped with the base 48 and a position at an outside of the base 48 where the leading end of the holding arm 20 and the base 48 are not overlapped.

Referring back to FIG. 3, the second driving unit 50 includes an actuator configured to move the first driving unit 30 back and forth along one horizontal direction by a power source such as a motor. For example, the second driving unit 50 moves the first driving unit 30 in the direction D1 (first direction), as illustrated in FIG. 3. Accordingly, the holding arm 20 provided in the first driving unit 30 is displaced in the direction D1, so that the workpiece W held by the holding arm 20 is moved in the direction D1.

The second driving unit 50 includes, for example, a housing 52, a sliding member 54, a guide rail 56, pulleys 58a and 58b, a belt 62, and a motor 64. The housing 52 accommodates therein the individual components belonging to the second driving unit 50. An opening 52a is provided at a wall of the housing 52 facing the multiple processing units U1.

The sliding member 54 is configured to be moved relative to the housing 52, and serves to support the first driving unit 30 (base 48). The sliding member 54 is extended along the direction D2, for example. A base end of the sliding member 54 is connected to the guide rail 56 and the belt 62 within the housing 52. A leading end of the sliding member 54 is protruded to an outside of the housing 52 through the opening 52a. The leading end of the sliding member 54 is connected with the corresponding one end of the base 48 of the first driving unit 30. The guide rail 56 is disposed within the housing 52 so as to be extended in a straight line shape along the direction D1 (a width direction of the housing 52).

The pulleys 58a and 58b are disposed at two opposite ends of the housing 52 in the direction D1. Each of the pulleys 58a and 58b is disposed within the housing 52 so as to be rotatable around a rotation axis corresponding to the direction D2. The belt 62 is wound around the pulleys 58a and 58b. The belt 62 is, for example, a timing belt. The motor 64 is a power source configured to generate a rotational torque. The motor 64 is, for example, a servo-motor. The motor 64 is connected to the pulley 58a. If the torque (driving force) by the motor 64 is delivered to the pulley 58a, the belt 62 wound around the pulleys 58a and 58b is moved along the direction D1. Accordingly, the sliding member 54 (first driving unit 30) is also moved back and forth along the direction D1. As the sliding member 54 (first driving unit 30) is moved along the direction D1, the first driving unit 30 is also moved along the direction D1.

Here, a transfer operation of the transfer device A3 performed when the workpiece W is carried into or out of one liquid processing unit U1 of the multiple liquid processing units U1 will be explained. If the transfer device A3 receives the workpiece W as the processing target in the liquid processing unit U1 from the shelf unit U10, the transfer device A3 rotates the driver 32 by the rotation driver 46 such that a direction in which the housing 34 (belt 42) is elongated corresponds to the direction D2. Then, the transfer device A3 moves the holding arm 20 up to a position where the holding arm 20 (workpiece W) faces the liquid processing unit U1 in the direction D2 (that is, a position where the holding arm 20 and the liquid processing unit U1 are aligned in the direction D2). Hereinafter, the position of the holding arm 20 (workpiece W) where the holding arm 20 located at the position where the leading end of the holding arm 20 is overlapped with the base 48 and the liquid processing unit U1 as a transfer destination face each other in the direction D2 will be referred to as "facing position".

Thereafter, the transfer device A3 moves the holding arm 20 along the direction D2 by the driver 32 of the first driving unit 30 so that the workpiece W is transferred from the facing position to an inside of the liquid processing unit U1. For example, the driver 32 moves the holding arm 20 along the direction D2 from the position where the leading end of the holding arm 20 is overlapped with the base 48 up to a position where the leading end of the holding arm 20 is not overlapped with the base 48. After the workpiece W is delivered into the liquid processing unit U1, the transfer device A3 moves, by the driver 32, the holding arm 20 not holding the workpiece W along the direction D2 up to the facing position.

To receive the workpiece W after being processed in the liquid processing unit U1, the transfer device A3 moves, by the driver 32, the holding arm 20 not holding the workpiece W into the liquid processing unit U1 from the facing position. After receiving the workpiece W from the liquid processing unit U1, the transfer device A3 moves the holding arm 20 from the inside of the liquid processing unit U1 to the facing position by the driver 32. By way of example, the driver 32 moves the holding arm 20 along the direction D2 from the position where the leading end of the holding arm 20 is not overlapped with the base 48 to the position where this leading end thereof is overlapped with the base 48. Thereafter, the transfer device A3 transfers the workpiece W from the facing position for a next processing (for example, a heat treatment in the heat treatment unit U2) by rotating the driver 32 with the rotation driver 46, or by moving the first driving unit 30 in the direction D1 with the second driving unit 50.

<Substrate Inspection Unit>

Figure 3:
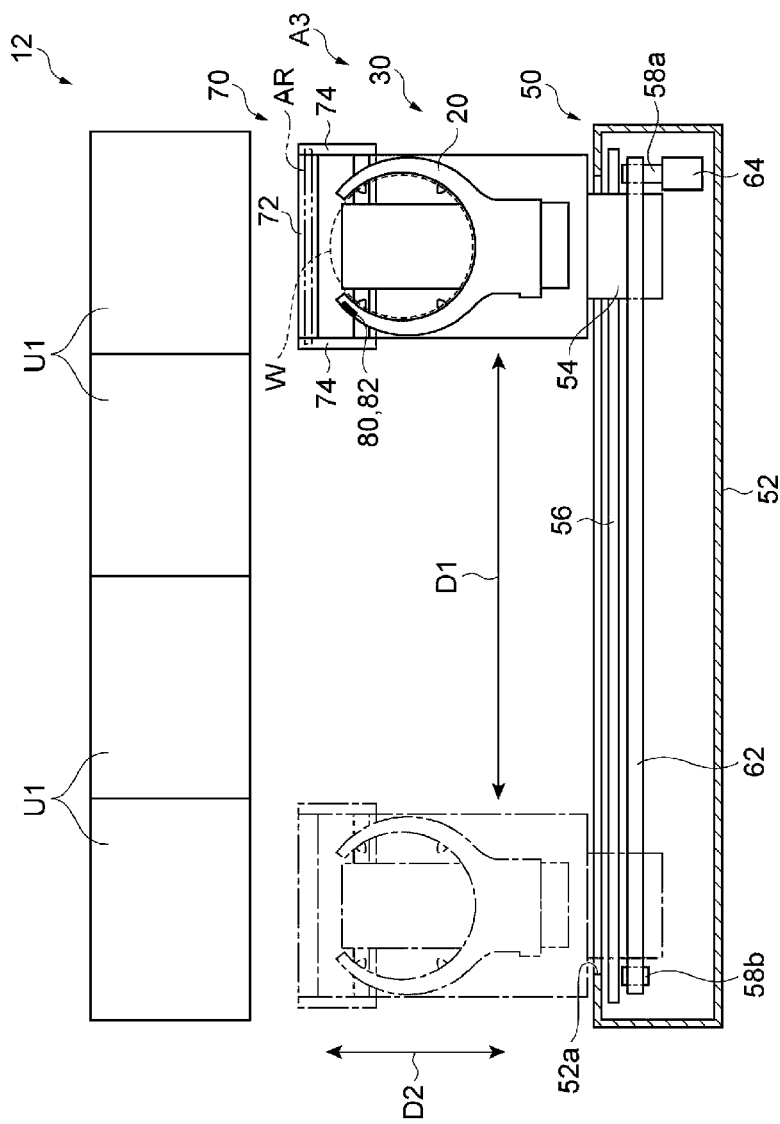
FIG. 3 is a plan view schematically illustrating an example of a processing module.

The processing module 12 is further equipped with a substrate inspection unit 70, as shown in FIG. 3. The substrate inspection unit 70 is used to inspect the workpiece W during a coating and developing processing between the inspection by the inspection unit U3 of the processing module 11 and the inspection by the inspection unit U3 of the processing module 14. The substrate inspection unit 70 acquires information (hereinafter, referred to as "surface information") indicating a surface state of the workpiece W held by the holding arm 20 at the outside of the processing unit such as the liquid processing unit U1. The substrate inspection unit 70 may acquire, as the surface information of the workpiece W, image information obtained by imaging the workpiece W.

The surface state as the inspection target by the substrate inspection unit 70 may refer to a state of any region of outer surfaces of the workpiece W. By way of example, the surface state may refer to a state of at least a part of the main surface Wa of the workpiece W, a state of at least a part of the main surface Wb opposite to the main surface Wa of the workpiece W, or a state of at least a part of a side surface Wc connecting the main surfaces Wa and Wb. The surface state may refer to a state of at least a part of a region including two or more of the main surface Wa, the main surface Wb and the side surface Wc of the workpiece W. As an example, the substrate inspection unit 70 acquires the surface information indicating a state of the entire region of the main surface Wa.

The substrate inspection unit 70 may be provided at the transfer device A3. By way of example, the substrate inspection unit 70 is provided at the first driving unit 30 of the transfer device A3. The substrate inspection unit 70 may have a sensor 72 (camera) configured to image the surface of the workpiece W. The sensor 72 may be provided at the transfer device A3. As an example, the sensor 72 is fixed (connected) to the housing 34 of the driver 32 with a fixing member 74 therebetween. Since the sensor 72 is fixed to the housing 34, the sensor 72 is also moved in the direction D1 as the holding arm 20 is moved by the second driving unit 50 of the transfer device A3. Meanwhile, even if the holding arm 20 is moved by the first driving unit 30 (driver 32) of the transfer device A3, the sensor 72 is not moved. That is, a relative position of the holding arm 20 (that is, the workpiece W held by the holding arm 20) with respect to the sensor 72 changes as the holding arm 20 is moved by the driver 32.

The sensor 72 is configured to be located between the workpiece W (holding arm 20) and the liquid processing unit U1 in the state that the holding arm 20 is disposed at the position where the leading end thereof is overlapped with the base 48. The sensor 72 may be disposed above the workpiece W held by the holding arm 20. For example, the sensor 72 has a visual field capable of imaging a region located thereunder. Hereinafter, the region which can be imaged by the sensor 72 is referred to as "acquisition region AR." That is, the acquisition region AR is a region where the surface information can be acquired by the substrate inspection unit 70.

The sensor 72 may be a line sensor (line sensor type camera) configured to acquire information (image information) from a line-shaped acquisition region AR by imaging elements in which pixels are one-dimensionally arranged. The acquisition region AR by the sensor 72 may be elongated along the direction D1 (the imaging elements may be arranged side by side in the direction D1). As an example, a width of the acquisition region AR in the direction D1 may be equal to or larger than a width of the workpiece W. In this case, the sensor 72 may be disposed such that the entire main surface Wa of the workpiece W passes through the acquisition region AR when the holding arm 20 is moved in the direction D2 by the first driving unit 30 (driver 32). The substrate inspection unit 70 may be further equipped with a light source (a plurality of light sources arranged in a line shape) configured to radiate light to the acquisition region AR.

<Environment Inspection Unit>

The processing module 12 may be further equipped with an environment inspection unit 80 configured to acquire information (hereinafter, referred to as "environment information") indicating a state within the processing unit such as the liquid processing unit U1. The environment inspection unit 80 has, for example, a sensor 82 configured to acquire the environment information The environment information acquired by the sensor 82 includes information which affects a processing result of the workpiece W in the processing unit. By way of example, the environment information detected by the sensor 82 includes an infrared ray (radiant energy of the infrared ray), a temperature, a moisture and an atmospheric pressure within the processing unit, an angle (posture) and a vibration of a member within the processing unit, a temperature of a hot plate within the processing unit, and so forth. The sensor 82 may be a MEMS (Micro Electro Mechanical System) which is an integration of a machine element part, a sensor element, an electronic circuit, and so forth. The sensor 82 is provided at the holding arm 20 such that the sensor 82 is located within the processing unit in the state that the holding arm 20 is disposed within the processing unit. As an example, the sensor 82 is provided at a portion of the holding arm 20 near the leading end thereof, as illustrated in FIG. 3.

<Control Device>

Figure 5:
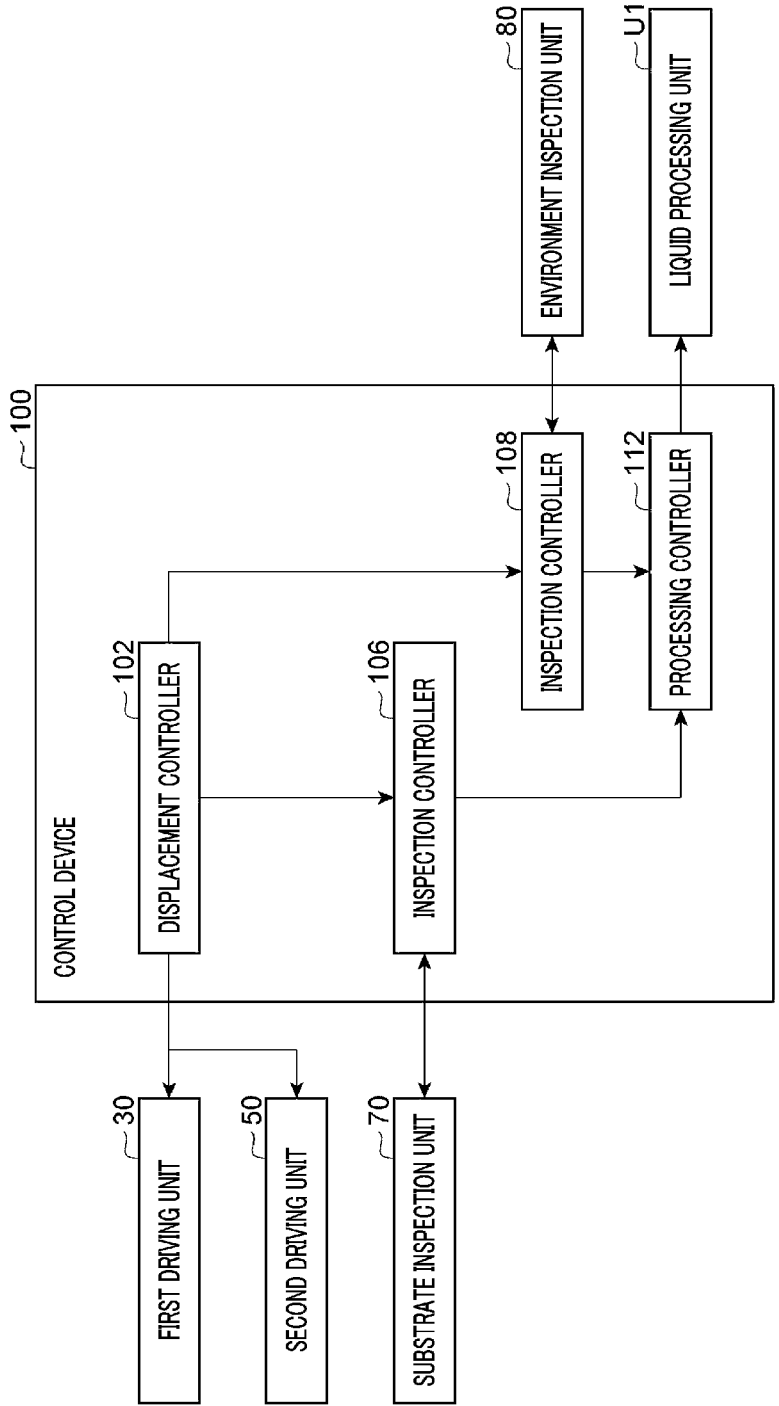
FIG. 5 is a block diagram illustrating an example of a functional configuration of a control device.
Figure 6:
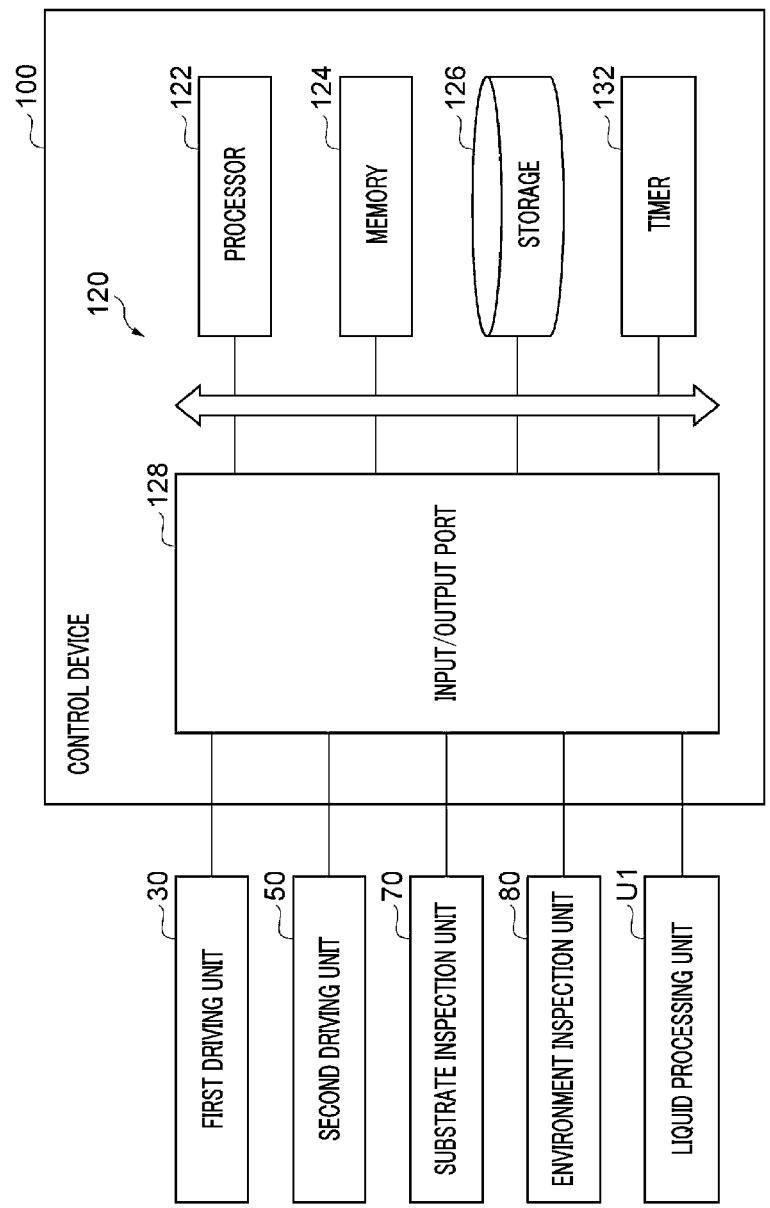
FIG. 6 is a block diagram illustrating an example of a hardware configuration of the control device.

Now, referring to FIG. 5 and FIG. 6, an example of the control device 100 will be described in detail. The control device 100 controls the coating and developing apparatus 2. The control device 100 is configured, at least, to control the transfer device A3 to carry the workpiece W into/from the liquid processing unit U1 by displacing the holding arm 20 in the state that the workpiece W is held by the holding arm; and to control the substrate inspection unit 70 to acquire the surface information of the workpiece W held by the holding arm 20 at the outside of the liquid processing unit U1. The control device 100 includes, for example, a displacement controller 102, inspection controllers 106 and 108, and a processing controller 112 as functional components (hereinafter, referred to as "functional modules").

The displacement controller 102 is configured to displace the holding arm 20 by the transfer device A3. By way of example, the displacement controller 102 displaces the holding arm 20 by the transfer device A3 such that the main surface Wa of the workpiece W passes through the acquisition region AR for the surface information by the substrate inspection unit 70. To elaborate, the displacement controller 102 controls the second driving unit 50 to move the holding arm 20 to the facing position where the holding arm 20 faces the liquid processing unit U1 in the direction D2.

The displacement controller 102 controls the first driving unit 30 (driver 32) to move the holding arm 20 from the facing position to the liquid processing unit U1. Accordingly, the workpiece W held by the holding arm 20 is carried into the liquid processing unit U1 after passing through the acquisition region AR. The displacement controller 102 controls the first driving unit 30 (driver 32) to move the holding arm 20 from the liquid processing unit U1 to the facing position. Accordingly, the workpiece W held by the holding arm 20 is carried out of the liquid processing unit U1 after passing through the acquisition region AR.

In the processing module 12 shown in FIG. 3 and FIG. 4, in any cases when the workpiece W is carried into the liquid processing unit U1 and carried out from the liquid processing unit U1, the holding arm 20 is displaced in a direction intersecting with the acquisition region AR when the workpiece W passes through the acquisition region AR. After the workpiece W is carried into the liquid processing unit U1 and before the workpiece W is carried out from the corresponding liquid processing unit U1, the displacement controller 102 may displace the holding arm 20 to carry another workpiece W into another liquid processing unit U1.

The inspection controller 106 (substrate inspection controller) controls the substrate inspection unit 70 to acquire the surface information of the workpiece W which is passing through the acquisition region AR. By way of example, the inspection controller 106 controls the sensor 72 to acquire the surface information of the main surface Wa of the workpiece W passing through the acquisition region AR when the workpiece W is carried into the liquid processing unit U1. The inspection controller 106 also controls the sensor 72 to acquire the surface information of the main surface Wa of the workpiece W passing through the acquisition region AR when the workpiece W is carried out of the liquid processing unit U1. Accordingly, the inspection controller 106 acquires the surface information of the workpiece W before being processed in the liquid processing unit U1 and the surface information of the workpiece W after being processed in the liquid processing unit U1.

As an example, the inspection controller 106 acquires the surface information of the main surface Wa of the workpiece W by allowing the sensor 72 to scan the main surface Wa of the workpiece W which is passing through the acquisition region AR. To elaborate, the inspection controller 106 controls the sensor 72 to acquire multiple surface information respectively indicating surface states of multiple regions of the main surface Wa while the main surface Wa of the workpiece W is passing through the acquisition region AR (without stopping the workpiece W). By combining these multiple surface information, the surface information of the main surface Wa can be obtained.

The inspection controller 108 (environment inspection controller) controls the environment inspection unit 80 to acquire the environment information upon the inside of the processing unit such as the liquid processing unit U1. The inspection controller 108 controls the sensor 82 to acquire the environment information within one liquid processing unit U1 (first liquid processing unit) of the multiple liquid processing units U1 in the state that the holding arm 20 is located in the corresponding one liquid processing unit U1. The inspection controller 108 controls the sensor 82 to acquire the environment information within another liquid processing unit U1 (second liquid processing unit) of the multiple liquid processing units U1 in the state that the holding arm 20 is located within the corresponding another liquid processing unit U1. The inspection controller 108 controls the sensor 82 to acquire the environment information within these liquid processing units U1 either when the workpiece W is carried into the liquid processing units U1 or when the workpiece W is carried out of the liquid processing units U1 at least.

The processing controller 112 controls the processing unit such as the liquid processing unit U1 to perform the preset processing on the workpiece W. For example, the processing controller 12 controls the liquid processing unit U1 to form the coating film of the resist on the main surface Wa of the workpiece W after the workpiece W is carried into the liquid processing unit U1. The processing controller 112 may control the liquid processing unit U1 based on at least one of the surface information of the workpiece W before being processed acquired by the inspection controller 106 or the environment information of the liquid processing unit U1 acquired by the inspection controller 108. As an example, the processing controller 112 may set a processing condition (for example, a rotation number of the workpiece W when coating the resist) in the liquid processing unit U1 based on the environment information acquired by the inspection controller 108.

The control device 100 may be implemented by one or more control computers. By way of example, the control device 100 includes a circuit 120 shown in FIG. 6. The circuit 120 includes one or more processors 122, a memory 124, a storage 126, an input/output port 128, and a timer 132. The storage 126 has a computer-readable recording medium such as, but not limited to, a hard disk. The recording medium stores thereon a program which causes the control device 100 to implement a substrate processing method to be described later. The recording medium may be a portable medium such as a non-volatile semiconductor memory, a magnetic disk or an optical disk. The memory 124 temporarily stores thereon the program loaded from the recording medium of the storage 126 and an operation result by the processor 122.

The processor 122 executes the aforementioned program in cooperation with the memory 124. The input/output port 128 performs an input/output of electric signals between the first driving unit 30, the second driving unit 50, the substrate inspection unit 70, the environment inspection unit 80, the liquid processing unit U1, and so forth, in response to an instruction from the processor 122. The timer 132 measures an elapsed time by, for example, counting a reference pulse of a preset cycle. Further, the hardware configuration of the control device 100 may be implemented by a dedicated logical circuit or an ASIC (Application Specific Integrated Circuit) which is an integration of logical circuits.

[Substrate Processing Method]

Figure 7:
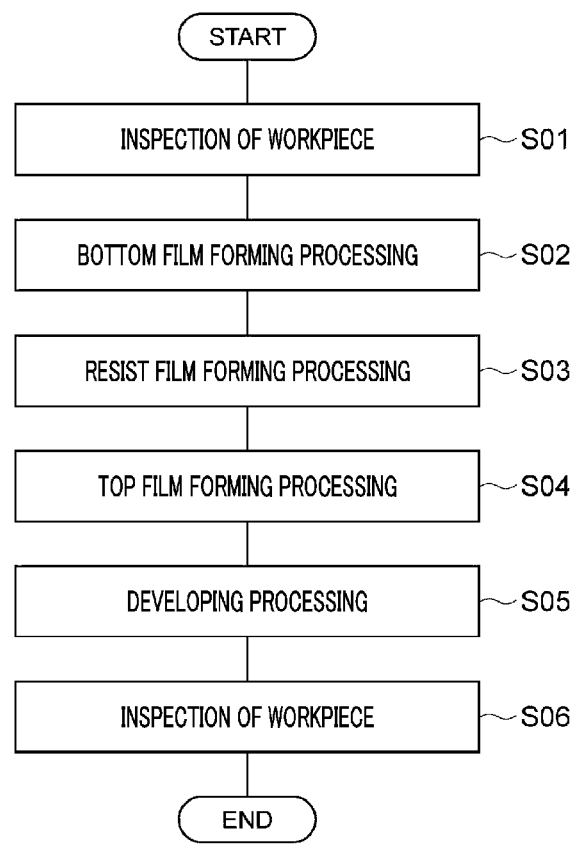
FIG. 7 is a flowchart illustrating an example of a coating and developing processing.

Now, referring to FIG. 7, the coating and developing processing performed in the coating and developing apparatus 2 will be descried as an example of the substrate processing method. FIG. 7 is a flowchart illustrating an example of the coating and developing processing, and it shows a sequence of the coating and developing processing upon a single workpiece W. First, the control device 100 controls the transfer device A1 to carry the workpiece W within the carrier C into the shelf unit U10, and controls the transfer device A7 to place this workpiece W in the cell for the processing module 11.

Subsequently, the control device 100 controls the transfer device A3 to transfer the workpiece W of the shelf unit U10 into the inspection unit U3 within the processing module 11. The control device 100 controls the inspection unit U3 to inspect the workpiece W before being subjected to the coating and developing processing in the coating and developing apparatus 2 (process S01).

Then, the control device 100 controls the processing module 11 to form the bottom film on the main surface Wa of the workpiece W (process S02). For example, in the process S02, the control device 100 controls the transfer device A3 to carry the workpiece W into the liquid processing unit U1. Then, the control device 100 controls the liquid processing unit U1 to form the coating film of the processing liquid for forming the bottom film on the main surface Wa of the workpiece W. The control device 100 then controls the transfer device A3 to carry the workpiece W having the coating film formed thereon into the heat treatment unit U2. Thereafter, the control device 100 controls the heat treatment unit U2 to form the bottom film on the main surface Wa of the workpiece W. Then, the control device 100 controls the transfer device A3 to return the workpiece W having the bottom film formed thereon back into the shelf unit U10, and controls the transfer device A7 to place this workpiece W in the cell for the processing module 12.

Next, the control device 100 controls the processing module 12 to form the resist film on the main surface Wa of the workpiece W on which the bottom film is formed (process S03). For example, in the process S03, the controller 100 controls the transfer device A3 to carry the workpiece W of the shelf unit U10 into any one of the liquid processing units U1 within the processing module 12. Then, the control device 100 (processing controller 112) controls the liquid processing unit U1 to form the coating film of the resist on the main surface Wa of the workpiece W. The control device 100 then controls the transfer device A3 to carry the workpiece W having the coating film of the resist into the heat treatment unit U2. Thereafter, the control device 100 controls the heat treatment unit U2 to form the resist film on the main surface Wa of the workpiece W. Then, the control device 100 controls the transfer device A3 to return the workpiece W having the resist film formed thereon back into the shelf unit U10, and controls the transfer device A7 to place this workpiece W in the cell for the processing module 13.

Subsequently, the control device 100 controls the processing module 13 to form the top film on the main surface Wa of the workpiece W on which the resist film is formed (process S04). For example, in the process S04, the control device 100 controls the transfer device A3 to carry the workpiece W into the liquid processing unit U1. Then, the control device 100 controls the liquid processing unit U1 to form the coating film of the processing liquid for forming the top film on the main surface Wa of the workpiece W. The control device 100 then controls the transfer device A3 to carry the workpiece W having the coating film formed thereon into the heat treatment unit U2. Thereafter, the control device 100 controls the heat treatment unit U2 to form the top film on the main surface Wa of the workpiece W. Then, the control device 100 controls the transfer device A3 to carry the workpiece W having the top film formed thereon into the shelf unit U11.

Thereafter, the control device 100 controls the transfer device A8 to send the workpiece W of the shelf unit U11 to the exposure apparatus 3. Afterwards, the control device 100 controls the transfer device A8 to receive, from the exposure apparatus 3, the workpiece W after being subjected to the exposure processing and place the received workpiece W in the cell for the processing module 14.

Subsequently, the control device 100 controls the processing module 14 to perform the developing processing on the workpiece W after being subjected to the exposure processing (process S05). For example, in the process S05, the control device 100 controls the transfer device A3 to carry the workpiece W into the heat treatment unit U2, and controls the heat treatment unit U2 to perform the heat treatment before the developing on the resist film of this workpiece W. Then, the control device 100 controls the transfer device A3 to carry the workpiece W after being subjected to the heat treatment before the developing into the liquid processing unit U1, and controls the liquid processing unit U1 to perform the developing processing on this workpiece W.

Next, the control device 100 controls the transfer device A3 to carry the workpiece W after being subjected to the developing processing into the heat treatment unit U2, and controls the heat treatment unit U2 to perform the heat treatment after the developing on the resist film of the workpiece W. The control device 100 then controls the transfer device A3 to carry the workpiece W after being subjected to the heat treatment after the developing into the inspection unit U3.

Then, the control device 100 controls the inspection unit U3 to inspect the workpiece W after being subjected to the developing processing including the heat treatments involved in the developing (process S06). Thereafter, the control device 100 controls the transfer device A3 to return the workpiece W back into the shelf unit U10, and controls the transfer device A7 and the transfer device A1 to return this workpiece W back into the carrier C. Through the above-described operations, the coating and developing processing upon the single workpiece W is completed.

Figure 8:
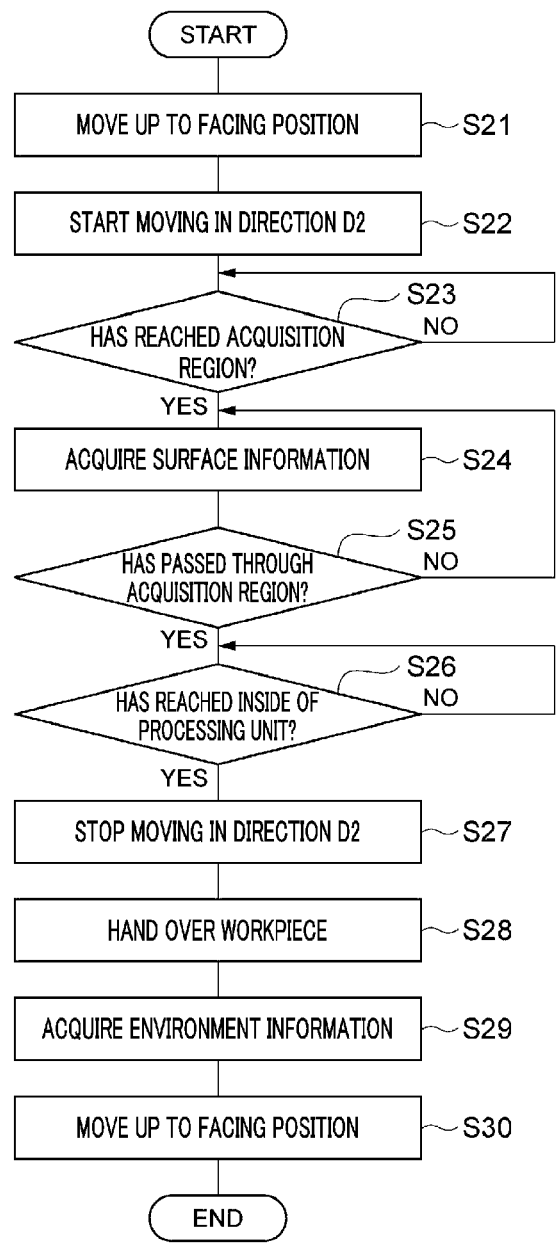
FIG. 8 is a flowchart illustrating an example of an inspection processing performed when a substrate is carried into a processing unit.

In the above-described coating and developing processing, the control device 100 controls the inspection unit U3 to carry out the inspection of the workpiece W before the processings by the coating and developing apparatus 2 are begun and after all the processings by the coating and developing apparatus 2 are completed. The control device 100 may control the substrate inspection unit 70 to inspect the workpiece W during the processing of each of the processes S02 to S05 in addition to the inspection of the workpiece W by the inspection unit U3. FIG. 8 is a flowchart showing a sequence of an inspection processing performed when the workpiece W before being subjected to the processing in the liquid processing unit U1 is carried into the corresponding liquid processing unit U1 in the process S03. The following description will be provided for an example where the sensor 72 is the line sensor, and the surface information indicating the state of the entire main surface Wa of the workpiece W is to be acquired.

In the inspection processing performed when the workpiece W is carried into the liquid processing unit U1, the control device 100 first performs a process S21 in the state that the holding arm 20 located at the position where the leading end thereof is overlapped with the base 48 in the direction D2 is holding the workpiece W. For example, in the process S21, the displacement controller 102 controls the second driving unit 50 to move the holding arm 20 up to the facing position where it faces the liquid processing unit U1 as the transfer destination.

Then, the control device 100 carries out a process S22. For example, in the process S22, the displacement controller 102 controls the driver 32 to start moving of the holding arm 20 in the direction D2. Accordingly, the workpiece W held by the holding arm 20 is begun to be moved toward the liquid processing unit U1 from the facing position.

Subsequently, the control device 100 performs a process S23. For example, in the process S23, the inspection controller 106 stands by until the workpiece W reaches the acquisition region AR for the surface information by the substrate inspection unit 70. As an example, the inspection controller 106 may make a determination upon whether at least a part of the workpiece W has reached the acquisition region AR based on a rotation amount of the motor 44 of the driver 32 or an elapsed time from the beginning of the moving of the holding arm 20 by the driver 32. If it is determined in the process S23 that the workpiece W has reached the acquisition region AR, the control device 100 performs a process S24. For example, in the process S24, the inspection controller 106 controls the substrate inspection unit 70 to acquire the surface information. As an example, the inspection controller 106 controls the sensor 72 to image the region of the main surface Wa of the workpiece W overlapped with the acquisition region AR.

Thereafter, the control device 100 carries out a process S25. For example, in the process S25, the inspection controller 106 stands by until the workpiece W held by the holding arm 20 passes through the acquisition region AR for the surface information. As an example, the inspection controller 106 may make a determination upon whether the entire region (main surface Wa) of the workpiece W has passed through the acquisition region AR (whether the workpiece W has been moved to the position where it is not overlapped with the acquisition region AR) based on a rotation amount of the motor 44 of the driver 42 or an elapsed time from the beginning of the moving of the holding arm 20 by the driver 32.

If it is determined in the process S25 that the workpiece W has not passed through the acquisition region AR yet (at least a part of the main surface Wa is still overlapped with the acquisition region AR), the inspection controller 106 performs the process S24 again. By repeating the processes S24 and S25, the substrate inspection unit 70 carries on acquiring the surface information of the workpiece W while the workpiece W is passing through the acquisition region AR. To elaborate, while the entire main surface Wa of the workpiece W is passing through the acquisition region AR, the inspection controller 106 controls the sensor 72 to image the multiple regions of the main surface Wa of the workpiece W in sequence, thus acquiring the surface information (image information) of the entire main surface Wa.

If it is determined in the process S25 that the workpiece W has passed through the acquisition region AR, the control device 100 carries out a process S26. For example, in the process S26, the displacement controller 102 stands by until the holding arm 20 reaches the inside of the liquid processing unit U1. As an example, the displacement controller 102 may make a determination upon whether the holding arm 20 (workpiece W) has reached the inside of the liquid processing unit U1 based on a rotation amount of the motor 44 of the driver 32 or an elapsed time from the beginning of the moving of the holding arm 20 by the driver 32. If it is determined in the process S26 that the holding arm 20 has reached the inside of the liquid processing unit U1, the control device 100 performs a process S27. For example, in the process S27, the displacement controller 102 controls the driver 32 to stop the moving of the holding arm 20 in the direction D2. Accordingly, the moving of the workpiece W toward the liquid processing unit U1 from the facing position is ended.

Subsequently, the control device 100 performs processes S28, S29 and S30. For example, in the process S28, the control device 100 controls the transfer device A3 and the liquid processing unit U1 to hand the workpiece W over to the liquid processing unit U1 from the holding arm 20. For example, in the process S29, the inspection controller 106 controls the environment inspection unit 80 (sensor 82) to acquire the environment information upon the inside of the liquid processing unit U1 in the state that the holding arm 20 is placed within the liquid processing unit U1. In the process S30, the displacement controller 102 controls the driver 32 to move the holding arm 20 not holding the workpiece W to the facing position from the liquid processing unit U1. Through the above-described operations, the inspection processing performed when the workpiece W is carried into the one liquid processing unit U1 is ended.

Figure 9:
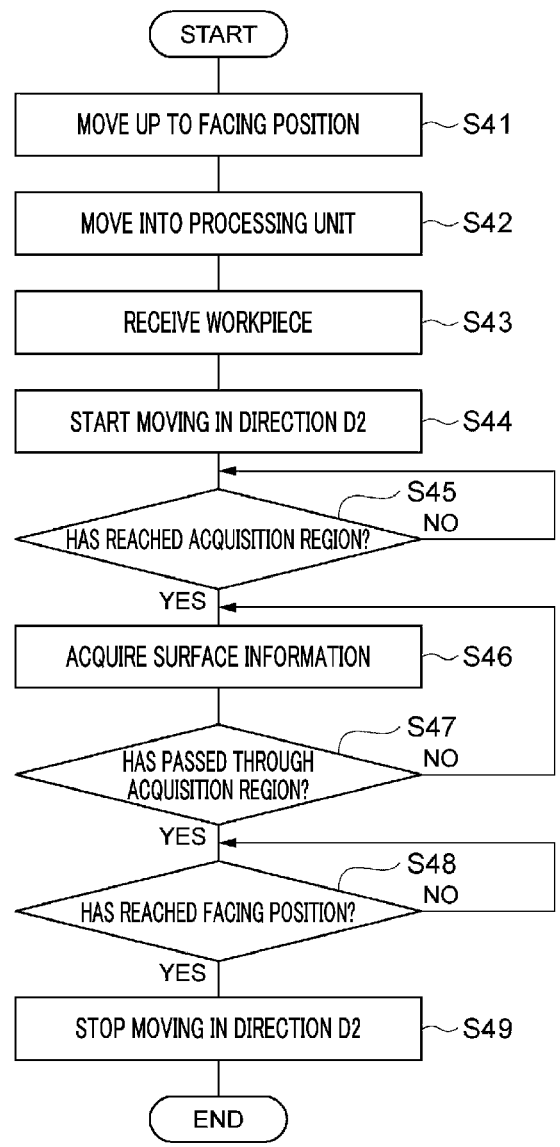
FIG. 9 is a flowchart illustrating an example of an inspection processing performed when the substrate is carried out from the processing unit.

FIG. 9 is a flowchart illustrating an example of an inspection processing performed when the workpiece W after being processed in the liquid processing unit U1 is carried out of the corresponding liquid processing unit U1 in the process S03 of forming the resist film. In the inspection processing performed when the workpiece W is carried out of the liquid processing unit U1, the control device 100 performs processes S41, S42 and S43 in the state that the holding arm 20 located at the position where the leading end thereof is overlapped with the base 48 in the direction D2 does not hold the workpiece W. For example, in the process S41, the displacement controller 102 controls the second driving unit 50 to move the holding arm 20 up to the facing position. For example, in the process S42, the displacement controller 102 controls the driver 32 to move the holding arm 20 from the facing position to the liquid processing unit U1. For example, in the process S43, the control device 100 controls the transfer device A3 and the liquid processing unit U1 to hand the processed workpiece W over to the holding arm 20 from the liquid processing unit U1.

Subsequently, the control device 100 carries out a process S44. For example, in the process S44, the displacement controller 102 controls the driver 32 to start moving of the holding arm 20 with the received the workpiece W thereon in the direction D2. Accordingly, the workpiece W held by the holding arm 20 is begun to be moved toward the facing position from the liquid processing unit U1.

Thereafter, the control device 100 performs a process S45. For example, in the process S45, the inspection controller 106 stands by until the workpiece W held by the holding arm 20 reaches the acquisition region AR for surface information by the substrate inspection unit 70, the same as in the above-described process S23. If it is determined in the process S45 that the workpiece W has reached the acquisition region AR, the control device 100 carries out a process S46. In the process S46, the inspection controller 106 controls the substrate inspection unit 70 to acquire the surface information of the region of the main surface Wa of the workpiece W overlapped with the acquisition region AR, the same as in the above-described process S24.

Afterwards, the control device 100 performs a process S47. For example, in the process S47, the inspection controller 106 stands by until the workpiece W held by the holding arm 20 passes through the acquisition region AR, the same as in the above-described process S25. If it is determined in the process S47 that the workpieces W has not passed through the acquisition region AR yet, the control device 100 performs the process S46 again. As the aforementioned processes S46 and S47 are repeated, the substrate inspection unit 70 carries on the acquisition of the surface information of the workpiece W while the workpiece W is passing through the acquisition region AR, the same as in the processes S24 and S25. As a result, the inspection controller 106 acquires the surface information of the entire main surface Wa.

If it is determined in the process S47 that the workpiece W has passed through the acquisition region AR, the control device 100 carries out a process S48. For example, in the process S48, the displacement controller 102 stands by until the holding arm 20 reaches the facing position. As an example, the displacement controller 102 may make a determination upon whether the holding arm 20 (workpiece W) has reached the facing position based on a rotation amount of the motor 44 of the driver 32 or an elapsed time from the beginning of the moving of the holding arm 20 by the driver 32. If it is determined in the process S48 that the holding arm 20 has reached the facing position, the control device 100 performs a process S49. For example, in the process S49, the displacement controller 102 controls the driver 32 to stop the moving of the holding arm 20 in the direction D2. Accordingly, the moving of the workpiece W from the liquid processing unit U1 toward the facing position is finished. Through the above-described operations, the inspection processing performed when the workpiece W is carried out of the one liquid processing unit U1 is ended.

In a period after the workpiece W is carried into the liquid processing unit U1 and before the corresponding workpiece W is carried out from the corresponding liquid processing unit U1, the processing controller 112 of the control device 100 controls the liquid processing unit U1 to form the coating film of the resist on the main surface Wa of the workpiece W. When the liquid processing in the liquid processing unit U1 is being performed, the control device 100 may control the transfer device A3 to carry another workpiece W into another liquid processing unit U1. At this time, the control device 100 may perform the same processings as the inspection processing sequence described in FIG. 8. In the processing which is the same as the process S29, the inspection controller 108 may control the inspection unit 80 (sensor 82) to acquire the environment information of the another liquid processing unit U1 in the state that the holding arm 20 is placed in this another liquid processing unit U1.

The above-described sequences of the coating and developing processing and the inspection processing are just an example and can be modified appropriately. By way of example, some of the above-described processes (processings) may be omitted, and the respective processes may be performed in different orders. Further, any two or more of the above-stated processes may be combined, or a part of the processes may be modified or deleted. Alternatively, in addition to the above-described processes, other processes may be performed. For example, in the above-described exemplary embodiment, the imaging status by the sensor 72 is switched after the arrival at the acquisition region AR and the passing through the acquisition region AR are determined. However, the inspection controller 106 may switch the imaging status by the sensor 72 based on the start and the end of the moving of the holding arm 20 in the direction D2 (for example, based on the performing of the processes S22 and S27). By way of example, the inspection controller 106 may control the sensor 72 to carry on the imaging of the workpiece W in a period until the process S27 is ended after the process S22 is performed.

Modification Example 1

Figure 10:
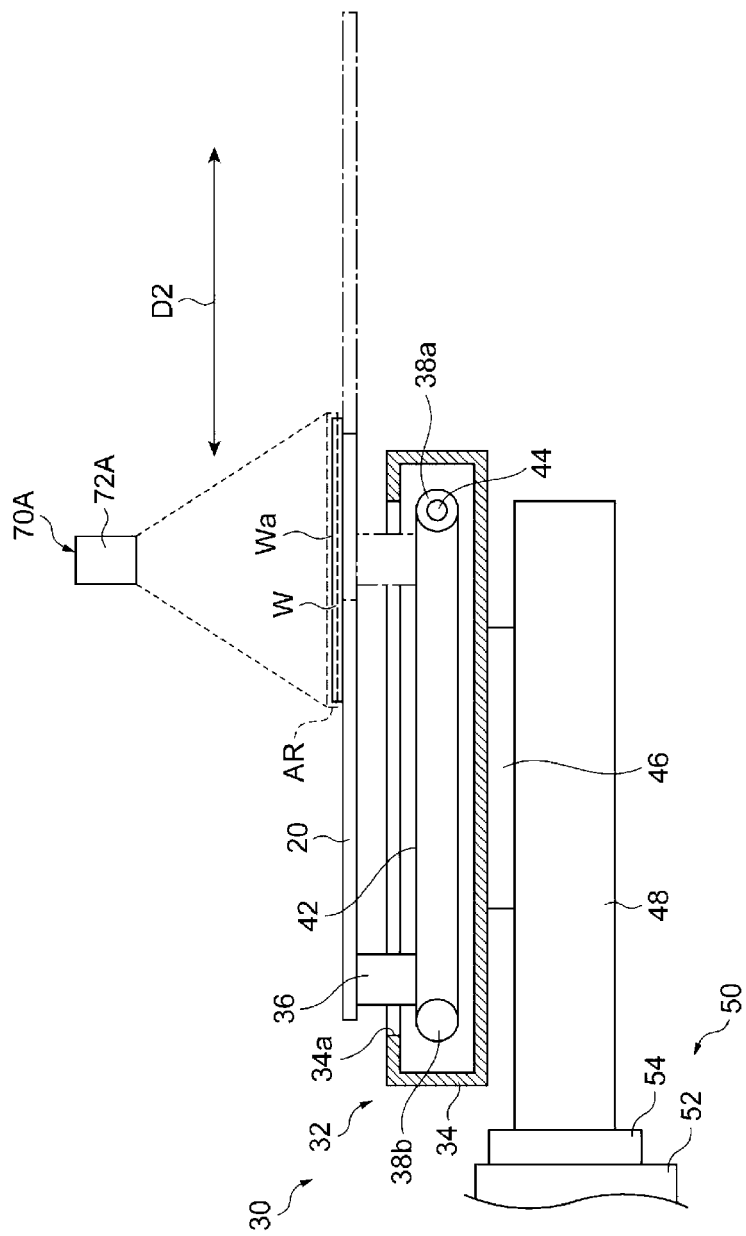
FIG. 10 is a side view schematically illustrating a transfer unit.

So far, the exemplary embodiment of the present disclosure has been described in detail. However, various modifications may be added to the above-described exemplary embodiment within the scope of the essence of the present disclosure. The processing module 12 may be equipped with a substrate inspection unit having an area sensor instead of the substrate inspection unit 70 having the line sensor. For example, as depicted in FIG. 10, the processing module 12 may be equipped with a substrate inspection unit 70A instead of the substrate inspection unit 70. The substrate inspection unit 70A has a sensor 72A instead of the sensor 72.

The sensor 72A is an area sensor (area sensor type camera) configured to image a two-dimensional region by imaging elements with two-dimensionally arranged pixels. An acquisition region AR (visional field) for surface information by the sensor 72A may be equal to or larger than the entire main surface Wa of the workpiece W. In this case, the sensor 72A is capable of acquiring the surface information (image information) of the entire main surface Wa in the state that the main surface Wa of the workpiece W is located in the acquisition region AR. The acquisition region AR (visional field) by the sensor 72A may be a two-dimensional region extending in the direction D1.

The substrate inspection unit 70A may be provided at the transfer device A3, the same as the substrate inspection unit 70. By way of example, the substrate inspection unit 70A (sensor 72A) is provided at the first driving unit 30. As an example, the sensor 72A may be fixed to the housing 34 via a fixing member (not shown). In this configuration as well, a position of the sensor 72A (a position of the acquisition region AR by the sensor 72A) is changed as the holding arm 20 is moved by the second driving unit 50, and a relative position of the holding arm 20 (workpiece W) with respect to the sensor 72A is changed as the holding arm 20 is moved by the driver 32. The sensor 72A may be disposed such that the acquisition region AR by the sensor 72A (imaging range of the sensor 72A) includes the entire main surface Wa in the state that the holding arm 20 is placed at the position where the leading end thereof is overlapped with the base 48.

FIG. 11 is a flowchart illustrating another example inspection processing performed when the workpiece W before being processed in the liquid processing unit U1 is carried into the corresponding liquid processing unit U1. Here, it is assumed that the sensor 72A has the visional field capable of imaging the entire main surface Wa of the workpiece W. In this inspection processing, the control device 100 performs a process S61 which is the same as the process S21 in the state that the holding arm 20 which is located at the position where the leading end thereof is overlapped with the base 48 is holding the workpieces W.

Then, the control device 100 performs processes S62 and S63. For example, in the process S62, the inspection controller 106 controls the substrate inspection unit 70A to acquire the surface information of the workpiece W. As an example, the inspection controller 106 controls the sensor 72A to acquire the surface information (image information) of the entire main surface Wa of the workpiece W. For example, in the process S63, the inspection controller 106 controls the driver 32 to move the holding arm 20 from the facing position into the liquid processing unit U1 along the direction D2.

Subsequently, the control device 100 performs processes S64 to S66, the same as the processes S28 to S30. Through these operations, the inspection processing performed when the workpiece W is carried into the liquid processing unit U1 is ended. In the above-described example inspection processing, since the acquisition region AR (visional field) by the sensor 72A includes the entire main surface Wa in the state that the holding arm 20 is located at the position where the leading end thereof is overlapped with the base 48, the imaging by the sensor is not performed while the holding member 20 is being moved in the direction D2, unlike in the inspection processing described in FIG. 8. In the inspection processing shown in FIG. 11, the acquisition of the surface information of the main surface Wa is performed at a timing when the moving of the holding arm 20 in the direction D1 and the moving of the holding arm 20 in the direction D2 are switched (at a timing between the process S61 and the process S63).

Further, the acquisition region AR by the sensor 72A may be located between the facing position and the liquid processing unit U1. In this case, the control device 100 may control the sensor 72A to acquire the surface information of the main surface Wa after temporarily stopping the holding arm 20 by the driver 32 during the moving of the holding arm 20 in the direction D2. When the workpiece W is carried out from the liquid processing unit U1, the control device 100 may perform the inspection processing, the same as the inspection processing performed when the workpiece W is carried into the liquid processing unit U1. In this inspection processing performed when the workpiece W is carried out, the control device 100 may control the sensor 72A to acquire the surface information of the entire main surface Wa in the state that the driver 32 moves the holding arm 20 to stop the workpiece W at the facing position. The inspection controller 106 may control the sensor 72A to acquire the surface information of the workpiece W while moving the holding arm 20 along the direction D1 by the second driving unit 50, or during or before the moving of the holding arm 20 in the direction D2 by the first driving unit 30.

Modification Example 2

The coating and developing apparatus 2 may carry the workpiece W into/from the processing unit such as the liquid processing unit U1 by a multi-joint arm instead of the transfer device A3 which is configured to move the workpiece W along the directions D1 and D2. A multi-joint arm 90 (transfer unit) shown in FIG. 12A and FIG. 12B includes a base 92, a rotator 94, a first arm 96, a second arm 97, and a holding hand 98 (holder).

The base 92 is provided on, for example, a bottom surface within the coating and developing apparatus 2. The rotator 94 is provided on the base 92 and configured to be rotated around a vertical axis Ax1. One end of the first arm 96 is connected to the base 92 via the rotator 94. As the rotator 94 is rotated around the axis Ax1, the first arm 96 is rotated around the axis Ax1. A rotation driver 96a is provided at the other end of the first arm 96, and one end of the second arm 97 is connected to the rotation driver 96a. The rotation driver 96a is configured to rotate the second arm 97 around a vertical axis Ax1.

A rotation driver 97a is provided at the other end of the second arm 97, and a bottom surface of the holding hand 98 is connected to the rotation driver 97a. The rotation driver 97a is configured to rotate the holding hand 98 around a vertical axis Ax3. The holding hand 98 is configured to place the workpiece W on a top surface thereof, and holds the workpiece W by, for example, attraction. Further, the multi-joint arm 90 may be further equipped with one or more other arms, and one of these arms may be configured to be rotated around an axis which intersects with the vertical direction.

When the workpiece W is carried into/from the processing unit by the multi-joint arm 90, the substrate inspection unit 70 (sensor 72) may not be provided at the multi-joint arm 90 but be fixed at a preset position. In this configuration, a position of the substrate inspection unit 72 is not changed wherever the holding hand 98 (workpiece W) is moved by the multi-joint arm 90. The control device 100 may control the multi-joint arm 90 (the rotator 94 and the rotation drivers 96a and 97a) such that the workpiece W held by the holding hand 98 passes through the acquisition region AR by the sensor 72 fixed at the preset position. For example, an operation of the multi-joint arm 90 may be previously set to allow the workpiece W (a region of the workpiece Was a target of surface information acquisition) to pass through the acquisition region AR. In case that the sensor 72 is the line sensor, the control device 100 (displacement controller 102) may control the multi-joint arm 90 to displace the holding hand 98 along a direction intersecting with the acquisition region AR by the line sensor. When the carry-in/carry-out of the workpiece W is performed by the multi-joint arm 90, the substrate inspection unit 70A (sensor 72A) fixed to a preset position may be used instead of the substrate inspection unit 70 (sensor 72).

Other Modification Examples

Although the above-described transfer device A3 has the single holding arm 20, the transfer device A3 may be equipped with another holding arm 20 and another first driving unit 30 configured to move this another holding arm 20 in the direction D2. The first driving unit 30 and the another first driving unit 30 may be arranged side by side in the vertical direction. In this configuration, the substrate inspection unit 70 (70A) may be further equipped with another sensor 72 (72A) configured to acquire surface information of a workpiece W held on another holding arm 20. The another sensor 72 (72A) may be provided at the another first driving unit 30. Alternatively, the single sensor 72 (72A) belonging to the substrate inspection unit 70 may acquire both the surface information of the workpiece W held by the holding arm 20 and the surface information of the workpiece W held by the another holding arm 20. The control device 100 may control the first driving unit 30 to carry the workpiece W held by the holding arm 20 into the liquid processing unit U1 or control the another first driving unit 30 to carry out the workpiece W held by the another holding arm 20 from the liquid processing unit U1.

Although the above-described substrate inspection unit 70 (70A) has the single sensor 72 (72A) for the single holding arm 20, the substrate inspection unit 70 (70A) may be further equipped with another sensor 72 (72A) configured to acquire surface information of the main surface Wb opposite to the main surface Wa. This another sensor 72 (72A) may be provided at the first driving unit 30.

In the coating and developing apparatus 2 as stated above, the inspection processing by the substrate inspection unit 70 is performed when the workpiece W is carried into the liquid processing unit U1 and, also, when the workpiece W is carried out from the liquid processing unit U1. However, the inspection controller 106 may control the substrate inspection unit 70 to perform the inspection processing when the workpiece W is carried into/from any of other processing units such as the heat treatment unit U1, the shelf units U10 and U11, and so forth. Further, any of the processing modules 11, 13 and 14 may also be equipped with the substrate inspection unit 70 and the environment inspection unit 80, the same as the processing module 12.

The inspection controller 106 may control the substrate inspection unit 70 not to perform the inspection processing on the workpiece W before being processed when the workpiece W is carried into the processing unit but to perform the inspection processing upon the processed workpiece W when the workpiece W is carried out from the processing unit. Alternatively, the inspection controller 106 may control the substrate inspection unit 70 not to perform the inspection processing on the processed workpiece W when the workpiece W is carried out from the processing unit but to perform the inspection processing on the workpiece W before being processed when the workpiece W is carried into the processing unit.

The substrate processing system 1 is not limited to the above-stated example. The configuration of the substrate processing system 1 is not particularly limited as long as it has a processing unit configured to perform a preset processing on a substrate, a transfer unit configured to carry the substrate (workpiece W) into/from the corresponding processing unit, and a substrate inspection unit configured to acquire information indicating a surface state of the workpiece W held by a holder of the transfer unit.

Effects of Exemplary Embodiment

As stated above, the coating and developing apparatus 2 according to the exemplary embodiment includes: the liquid processing unit U1 configured to perform the preset processing on the workpiece W; the transfer device A3, including the holding arm 20 configured to hold the workpiece W, configured to carry the workpiece W into/from the liquid processing unit U1 by displacing the holding arm 20 which holds the workpiece W; and the substrate inspection unit 70 configured to acquire the information indicating the surface state of the workpiece W held by the holding arm 20 at the outside of the liquid processing unit U1.

The substrate processing method according to the exemplary embodiment includes carrying the workpiece W into/from the liquid processing unit U1 configured to perform the preset processing on the workpiece W by displacing the holding arm 20 configured to hold the workpiece W in the state that the workpiece W is held by the holding arm 20; and acquiring the information indicating the surface state of the workpiece W held by the holding arm 20 at the outside of the liquid processing unit U1.

If the inspection of the workpiece W is performed for every processing performed in the coating and developing apparatus 2, reliability of a processing result in the coating and developing apparatus 2 is improved. If, however, the workpiece W is transferred to the inspection unit to inspect the workpiece W therein before and after every processing, a throughput of the coating and developing apparatus 2 is reduced. In the coating and developing apparatus 2 and the substrate processing method according to the exemplary embodiment, however, since the surface information of the workpiece W held by the holding arm 20 is acquired, the inspection processing on the workpiece W can be carried out when the workpiece W is being transferred at the outside of the processing unit. That is, to perform the processing in the liquid processing unit U1, the workpiece W needs to be transferred at the outside of the liquid processing unit U1. In the coating and developing apparatus 2 and the substrate processing method according to the exemplary embodiment, this transfer time is used as a chance to perform the inspection processing. Thus, according to the coating and developing apparatus 2 and the substrate processing method of the exemplary embodiment, it is possible to improve the reliability of the processing result while improving the throughput.

The substrate inspection unit 70 may be provided at the transfer device A3. In this case, the acquisition region AR for the surface information of the workpiece W by the substrate inspection unit 70 changes as the transfer device A3 is moved. Accordingly, the inspection of the workpiece W can be performed at a position close to the liquid processing unit U1.

The transfer device A3 may be further equipped with the first driving unit 30 configured to move the holding arm 20 along the direction D2 and the second driving unit 50 configured to move the first driving unit 30 along the direction D1. The substrate inspection unit 70 may be provided at the first driving unit 30. In this case, since the acquisition region AR is moved as the first driving unit 30 is moved by the second driving unit 50, it is possible to inspect the workpiece W at a position even closer to the liquid processing unit U1.

The coating and developing apparatus 2 may be further equipped with the displacement controller 102 configured to control the transfer device A3 to displace the holding arm 20 such that the main surface Wa of the workpiece W passes through the acquisition region AR of the surface information by the substrate inspection unit 70; and the inspection controller 106 configured to control the substrate inspection unit 70 to acquire the surface information indicating the surface state of the workpiece W when the workpiece W is carried into the liquid processing unit U1 and when it is carried out from the liquid processing unit U1, individually. In this case, since the surface state can be inspected before and after the processing in the liquid processing unit, the reliability is more improved. To perform the processing in the liquid processing unit U1, the transferring operation of carrying the workpiece W into the liquid processing unit U1 and the transferring operation of carrying the workpiece W from the liquid processing unit U1 are required. In this configuration, since the inspection is performed by using these two transferring operations, the reliability of the processing result can be improved without accompanying the reduction of the throughput.

The coating and developing apparatus 2 may be further equipped with the displacement controller 102 configured to control the transfer device A3 to displace the holding arm 20 such that the main surface Wa of the workpiece W passes through the acquisition region AR of the surface information by the substrate inspection unit 70; and the inspection controller 106 configured to control the substrate inspection unit 70 to acquire the multiple information respectively indicating the surface states of the multiple regions in the main surface Wa of the workpiece W while the main surface Wa of the workpiece W is passing through the acquisition region AR. In this case, the surface information of the region larger than the acquisition region AR by the substrate inspection unit 70 can be obtained, so that the substrate inspection unit 70 can be simplified. Further, since the workpiece W is moved into/from the substrate inspection unit 70 as the workpiece W is carried into or out of the liquid processing unit U1, the workpiece W need not be moved additionally only for the intention of acquiring the surface information of the multiple regions by the substrate inspection unit 70. That is, the substrate inspection unit 70 can be simplified without complicating other devices of the substrate inspection unit 70.

The substrate inspection unit 70 may be equipped with the line sensor configured to acquire the surface information from the line-shaped acquisition region AR. The displacement controller 102 may displace the holding arm 20 along the direction intersecting with the acquisition region AR of the surface information by the line sensor. Since the line sensor has the imaging elements arranged one-dimensionally, the substrate inspection unit 70 can be simplified as compared to the case where the area sensor having the two-dimensionally arranged imaging elements is used. Further, since image quality can be improved as compared to the area sensor, it is possible to acquire the surface information having more detailed information.

The substrate inspection unit 70 may be equipped with the arear sensor configured to acquire the surface information from the acquisition region AR which is enlarged in a plane shape. In this case, as compared to the line sensor, a time required to acquire the surface information can be shortened.

The coating and developing apparatus 2 may be further equipped with the environment inspection unit 80 provided at the holding arm 20 and configured to acquire the environment information upon the inside of the liquid processing unit U1. In this case, since an additional sensor for acquiring the environment information upon the inside of the liquid processing unit U1 can be omitted, the liquid processing unit U1 can be simplified.

The coating and developing apparatus 2 may be further equipped with another liquid processing unit U1 configured to perform a preset processing on the workpiece W and the inspection controller 108 configured to control the environment inspection unit 80 to acquire the environment information. The transfer device A3 may be further configured to carry the workpiece W into/from the another liquid processing unit U1. The inspection controller 108 may control the environment inspection unit 80 to acquire the information upon the inside of the liquid processing unit U1 in the state that the holding arm 20 is located within the liquid processing unit U1, and may control the environment inspection unit 80 to acquire environment information upon the inside of the another liquid processing unit U1 in the state that the holding arm 20 is located in the another liquid processing unit U1. In this case, the environment information of the liquid processing unit U1 and the environment information of the another liquid processing unit U1 can be both obtained by the same sensor 82. Therefore, as compared to a case where the measurements for the liquid processing unit U1 and the another liquid processing unit U1 are performed by individual sensors, an inter-apparatus error in measurement values of the sensors can be reduced.

According to the exemplary embodiment, it is possible to provide the substrate processing apparatus and the substrate processing method capable of improving the throughput and the reliability of the processing result.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
   a processing unit configured to perform a preset processing on a substrate;
   a transfer unit, including a holder configured to hold the substrate, configured to carry the substrate into/from the processing unit by displacing the holder which holds the substrate; and
   a substrate inspection unit configured to acquire, at an outside of the processing unit, information indicating a surface state of the substrate held by the holder,
   wherein the substrate inspection unit is provided at the transfer unit,
   wherein the transfer unit further includes a first driving unit configured to move the holder along a first direction and a second driving unit configured to move the first driving unit along a second direction, and
   the substrate inspection unit is provided at the first driving unit.

2. The substrate processing apparatus of claim 1, further comprising:
   a displacement controller configured to control the transfer unit to displace the holder such that a surface of the substrate passes through an acquisition region of the information by the substrate inspection unit; and
   a substrate inspection controller configured to control the substrate inspection unit to acquire the information indicating the surface state of the substrate when the substrate is carried into the processing unit and when the substrate is carried out from the processing unit individually.

3. The substrate processing apparatus of claim 1, further comprising:
   a displacement controller configured to control the transfer unit to displace the holder such that a surface of the substrate passes through an acquisition region of the information by the substrate inspection unit; and
   a substrate inspection controller configured to control the substrate inspection unit to acquire multiple information respectively indicating multiple surface states of multiple regions in the surface of the substrate while the surface of the substrate is passing through the acquisition region.

4. The substrate processing apparatus of claim 2,
wherein the substrate inspection unit comprises a line sensor configured to acquire the information from a line-shaped region, and
the displacement controller displaces the holder along a direction intersecting with the acquisition region of the information by the line sensor.

5. The substrate processing apparatus of claim 1,
wherein the substrate inspection unit comprises an area sensor configured to acquire the information from a region enlarged in a plane shape.

6. The substrate processing apparatus of claim 1, further comprising:
an environment inspection unit provided at the holder and configured to acquire environment information upon an inside of the processing unit.

7. The substrate processing apparatus of claim 6, further comprising:
a second processing unit configured to perform a preset processing on the substrate; and
an environment inspection controller configured to control the environment inspection unit to acquire the environment information,
wherein the transfer unit is further configured to carry the substrate into/from the second processing unit, and
the environment inspection controller controls the environment inspection unit to acquire the environment information upon the inside of the processing unit in a state that the holder is located within the processing unit, and controls the environment inspection unit to acquire environment information upon an inside of the second processing unit in a state that the holder is located within the second processing unit.

8. A substrate processing method, comprising:
carrying a substrate into/from a processing unit configured to perform a preset processing on the substrate by displacing a holder included in a transfer unit and configured to hold the substrate in a state that the substrate is held by the holder; and
acquiring, by a substrate inspection unit disposed at an outside of the processing unit, information indicating a surface state of the substrate held by the holder,
wherein the substrate inspection unit is provided at the transfer unit,
wherein the transfer unit further includes a first driving unit configured to move the holder along a first direction and a second driving unit configured to move the first driving unit along a second direction, and
the substrate inspection unit is provided at the first driving unit.

* * * * *

UNITED STATES PATENT AND TRADEMARK OFFICE
CERTIFICATE OF CORRECTION

| | | |
|---|---|---|
| PATENT NO. | : 12,027,393 B2 | Page 1 of 1 |
| APPLICATION NO. | : 17/236160 | |
| DATED | : July 2, 2024 | |
| INVENTOR(S) | : Takuya Mori | |

It is certified that error appears in the above-identified patent and that said Letters Patent is hereby corrected as shown below:

In the Specification

Column 18, Line 17, "axis Ax1" should be -- axis Ax2 --.

Signed and Sealed this
Seventeenth Day of December, 2024

Derrick Brent
*Acting Director of the United States Patent and Trademark Office*